United States Patent
Komino et al.

[11] Patent Number: 6,167,323
[45] Date of Patent: Dec. 26, 2000

[54] METHOD AND SYSTEM FOR CONTROLLING GAS SYSTEM

[75] Inventors: Mitsuaki Komino, Tokyo-To; Osamu Uchisawa; Yasuhiro Chiba, both of Sendai, all of Japan

[73] Assignee: Tokyo Electron Limited, Tokyo, Japan

[21] Appl. No.: 09/130,668

[22] Filed: Aug. 7, 1998

[30] Foreign Application Priority Data

Aug. 12, 1997 [JP] Japan .................................. 9-230260

[51] Int. Cl.[7] .................................................. G05D 23/00
[52] U.S. Cl. .......................... 700/121; 700/300; 700/289
[58] Field of Search .................................. 700/121, 117, 700/116, 119, 289, 299, 300, 301; 427/255.11, 99, 255.12; 118/719, 712, 715

[56] References Cited

U.S. PATENT DOCUMENTS

| | | | |
|---|---|---|---|
| 5,376,213 | 12/1994 | Ueda et al. | 156/345 |
| 5,753,891 | 5/1998 | Iwata et al. | 219/390 |
| 5,769,952 | 6/1998 | Komino | 118/733 |
| 5,900,103 | 5/1999 | Tomoyasu et al. | 156/345 |

*Primary Examiner*—William Grant
*Assistant Examiner*—Kidest Bahta
*Attorney, Agent, or Firm*—Morrison & Foerster

[57] ABSTRACT

Flow sensors 41 and 42 for detecting a flow load including the presence of a flow of gas are provided in supply lines 2a through 2d for supplying a given gas into a treatment chamber 6. A CPU 40 is provided for previously storing control parameters corresponding to the presence of a flow of gas. The presence of a flow of gas or a flow of IPA is detected by the flow sensors 41, 42 or an IPA supply pump 43, and detected signals are transmitted to the CPU 40. On the basis of a control signal outputted from the CPU 40, a cartridge heater 14, inner and outer tube heaters 25 and 26 and an insulation heater 52 are controlled. Thus, a control parameter adopted in accordance with the presence of a flow of gas to be used is determined, so that the control parameter previously stored in a data table 100 is selected in accordance with a control mode to control the temperature or pressure of the gas.

23 Claims, 11 Drawing Sheets

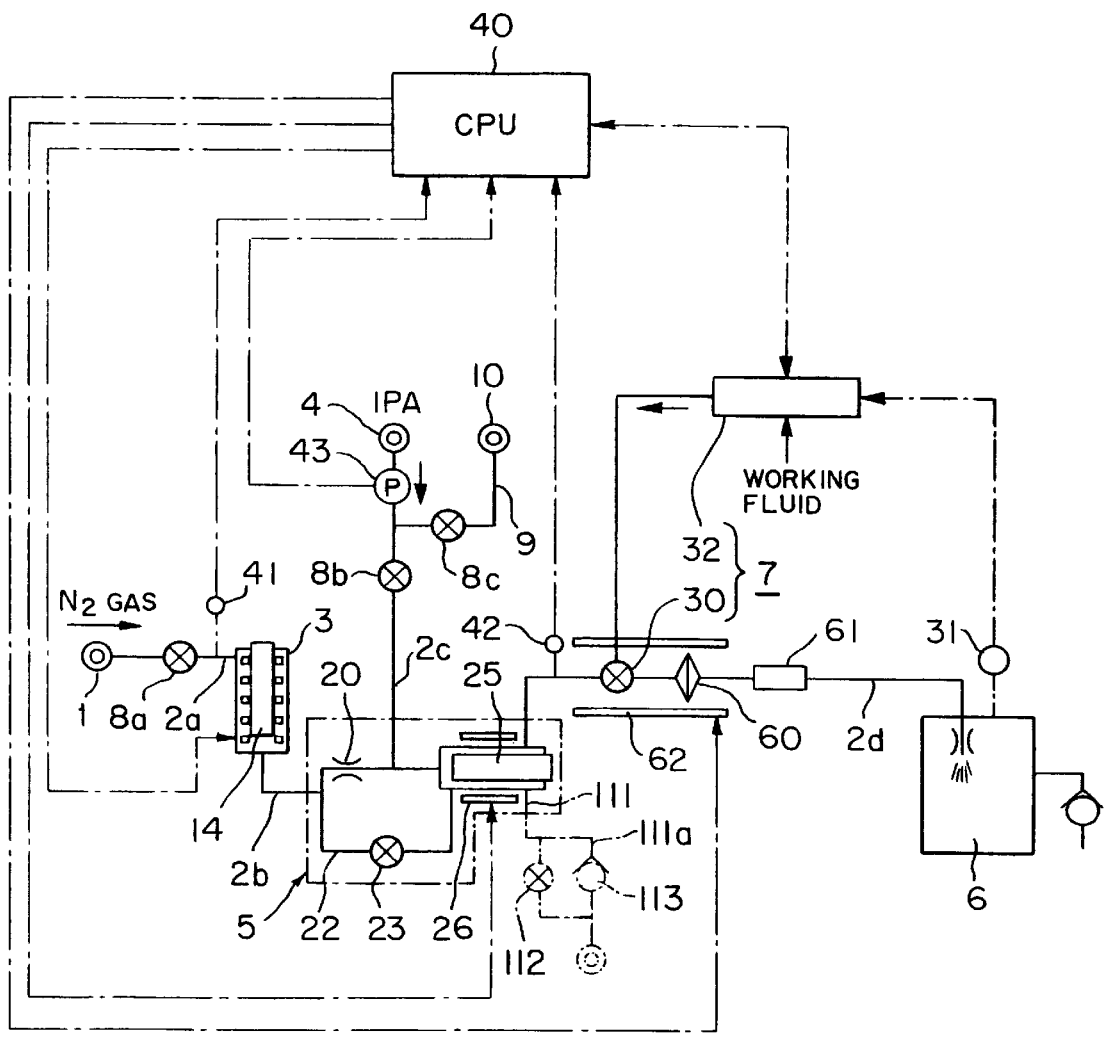
F I G. 1

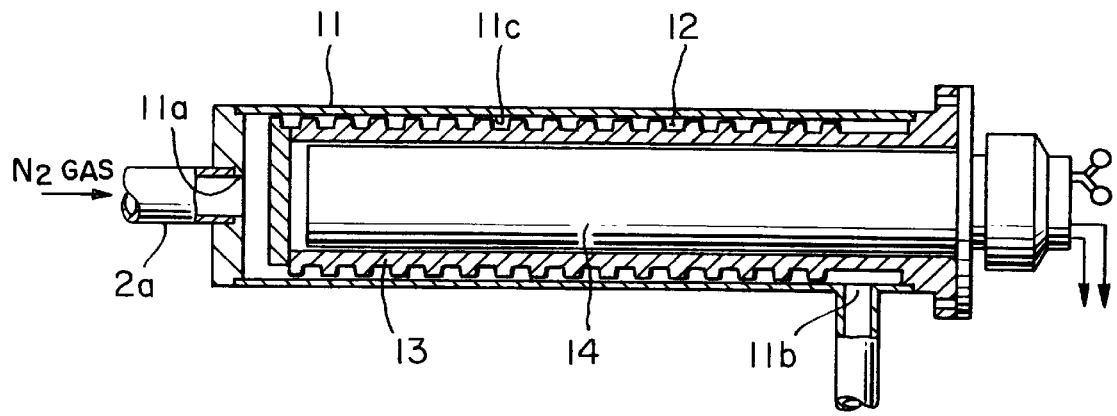
F I G. 2(a)
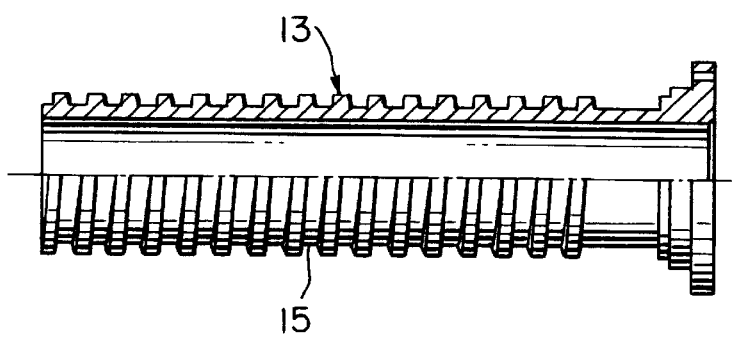
F I G. 2(b)

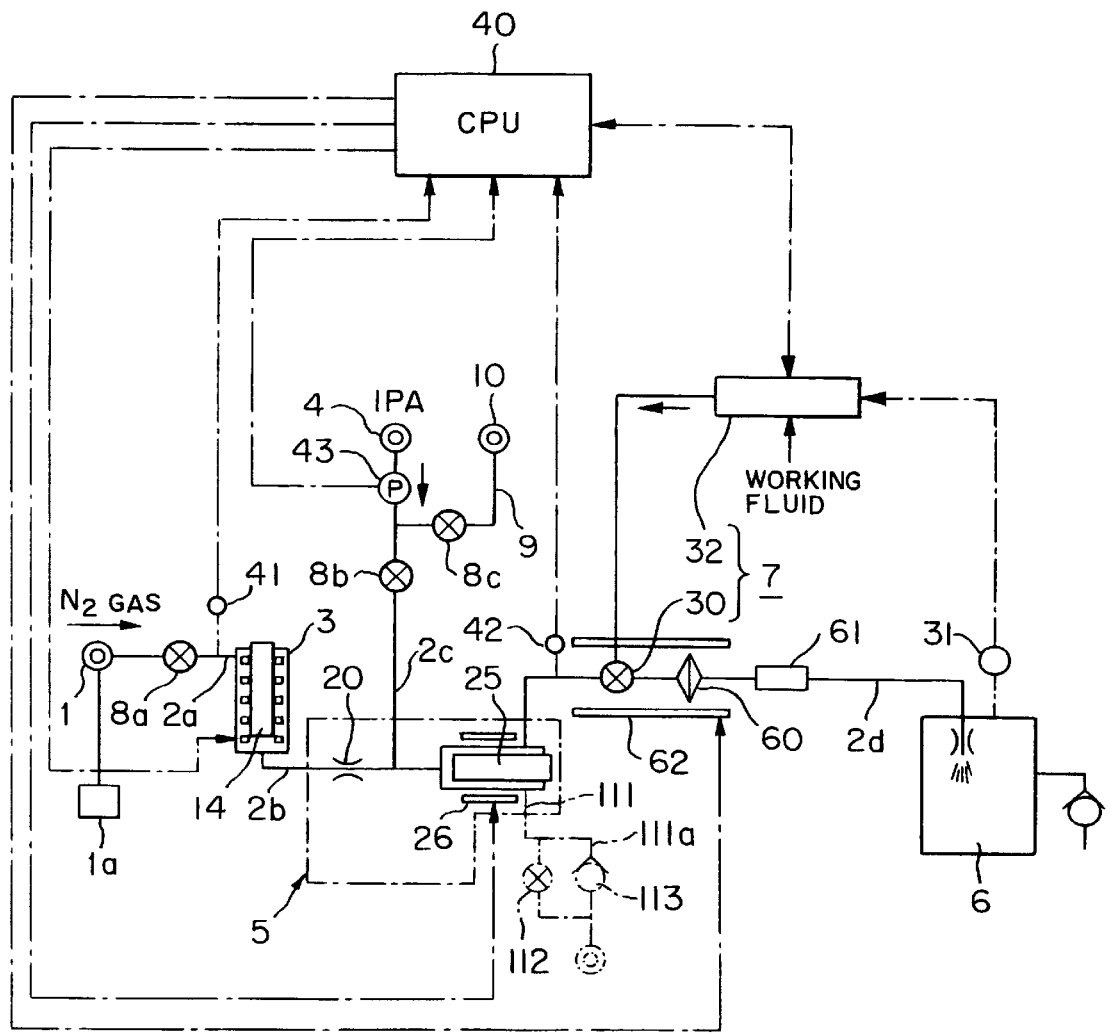
F I G. 11

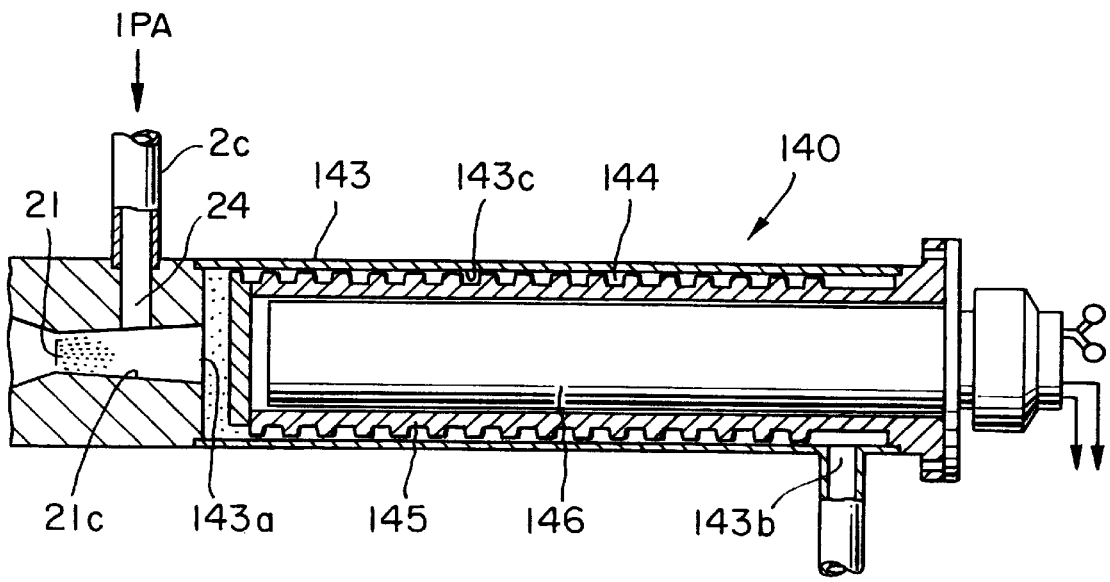
F I G. 12 (a)
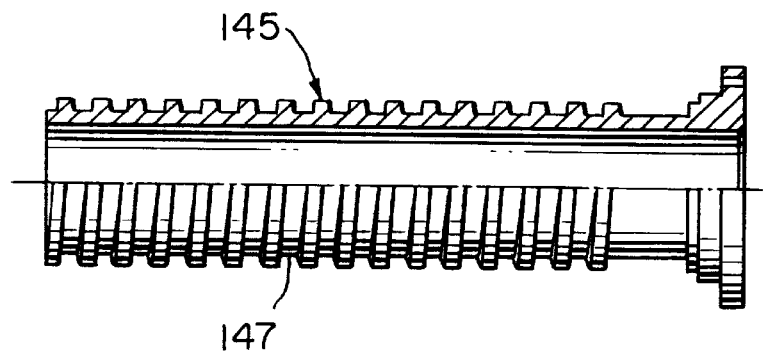
F I G. 12 (b)

METHOD AND SYSTEM FOR CONTROLLING GAS SYSTEM

BACKGROUND OF THE INVENTION

1. Field of The Invention

The present invention relates generally to a method and system for controlling a gas system having a plurality of control modes. More specifically, the invention relates to a method and system for controlling a gas system for use in a semiconductor production process.

2. Related Background Art

In a typical production process in a semiconductor equipment, there is widely adopted a method for cleaning an object to be treated (which will be hereinafter referred to as a "wafer or the like"), such as a semiconductor wafer and a glass substrate for a LCD, by subsequently dipping the wafer or the like in a treatment solution, such as a chemical or a rinsing solution (a cleaning solution), which is stored in a treatment bath. In such a cleaning treatment, a drying treatment for removing the moisture content of the wafer or the like to dry the wafer or the like is carried out by bringing the surface of the wafer or the like, which has been cleaned, with a dry gas of vapor of a volatile organic solvent, such as isopropyl alcohol (IPA), to condense or absorb the vapor of the dry gas.

A conventional drying system of this type comprises: a supply part for supplying a carrier gas, e.g., an inert gas, such as nitrogen ($N_2$); a vapor generator for heating a dry gas, e.g., isopropyl alcohol (IPA), to generate vapor; a supply line for supplying vapor generated by the vapor generator, i.e., the dry gas, to a drying chamber via a shut-off valve; and a heater for heating the supply line. Therefore, since it is important to control the temperature of $N_2$ gas and the dry gas, which are used for the drying treatment, the temperatures of heaters provided in a $N_2$ gas supply line, a dry gas supply line and a vapor generator are conventionally controlled.

In a semiconductor production process, a dry etching technique is essential in order to form a fine pattern in a wafer or the like. The dry etching is designed to produce plasmas with a reactive gas in vacuum, to each various materials on a wafer or the like with ions, neutral radicals, atoms or molecules in the produced plasmas. In the dry etching, various gases are used in accordance with the kind of etching materials.

Typically, in an etching system of this type, a container having a closed treatment chamber has an etching gas introducing portion, and an evacuation port for evacuating the interior of the treatment chamber to a predetermined pressure-reduced atmosphere (vacuum). In addition, one of flat plate electrodes, which face each other in the treatment chamber and which also serve as susceptors, is connected to a high-frequency power supply, and the other flat plate electrode is grounded to the container. While the interior of the treatment chamber is evacuated to a predetermined pressure-reduced atmosphere in accordance with the kinds of materials to be etched and reactive gases to be used, a high-frequency power is applied between both electrodes to produce a plasma discharge to etch the wafer or the like with ions, electrons and neutral active species in the produced plasmas. Therefore, since it is important to control the pressure in a treatment chamber at a predetermined pressure-reduced atmosphere in an etching treatment, a pressure regulating means is conventionally provided in an exhaust line connected to an evacuation port, to control the pressure in a treatment chamber.

However, such conventional drying and etching treatments are not designed to change a control parameter every kind and supply condition of gases to carry out the temperature and pressure controls.

Therefore, although there is no problem when a reduced thermal or pressure loaded condition is controlled by using a control parameter for a severe thermal or pressure loaded condition, there is a problem in that control is failed immediately after the reverse situation occurs. In this case, although only the level of load is not so great matter, there is a disadvantage in that it is not basically possible to use a common control parameter between quite different loaded conditions.

SUMMARY OF THE INVENTION

It is therefore an object of the present invention to eliminate the aforementioned problems and to provide a method and system for controlling a gas system, which previously stores a control parameter in accordance with the presence of a flow of gas to be used, and selects a control parameter corresponding to each of conditions to control temperature or pressure.

In order to accomplish the aforementioned and other objects, according to a first aspect of the present invention, there is provided a method for controlling a gas system having a plurality of control modes, the method comprising the steps of: defining a corresponding one of the plurality of control modes, in accordance with the presence of a flow of a given gas contained in the gas system; previously storing a control parameter to be adopted, in a data table every control mode of the plurality of control modes; detecting a flow load of the given gas; selecting a corresponding control mode from the plurality of control modes on the basis of the detected result of the flow load of the given gas, and selecting the control parameter in the selected control mode from the data table; and controlling gas heating means for heating the given gas, on the basis of the selected control parameter.

According to this control method, since a corresponding one of a plurality of control modes is defined in accordance with the presence of a flow of a given gas, it is possible to simply classify the plurality of control modes, so that it is possible to easily select a desired control mode. A control parameter to be adopted is previously stored in a data table every control mode so as to control the temperature of a gas system in the optimum state. Since the control parameter to be adopted is previously stored in the data table every control mode of the plurality of control modes, a corresponding control mode can be selected on the basis of the detected result of the flow load of the given gas, and the control parameter in the selected control mode can be quickly selected from the data table, so that it is possible to control the temperature of the gas system in the optimum state every control mode of the plurality control modes.

In this control method, when it is determined on the basis of the detected result of the flow load of the given gas that the flow of the given gas does not exist, a control mode for preheating and controlling the gas heating means itself may be selected, and the control parameter in the selected control mode may be selected from the data table.

In addition, the control parameter to be adopted in accordance with the magnitude of the flow load of the given gas may be previously stored in the data table, and when it is determined on the basis of the detected result of the flow load of the given gas that the flow of the given gas exists, the control parameter may be selected in accordance with the magnitude of the flow load on the basis of the detected result of the flow load of the given gas, to control the gas heating means on the basis of the selected control parameter.

Thus, since the control parameter to be adopted is previously stored in the data table in accordance with the magnitude of the flow load of the give gas, it is possible to accurately select a control parameter in multistage in accordance with the magnitude of the flow load, and it is possible to accurately control the gas heating means on the basis of the selected control parameter, so that it is possible to accurately control the temperature of the gas system in the optimum state.

According to a second aspect of the present invention, there is provided a method for controlling a gas system having a plurality of control modes, the method comprising the steps of: defining a corresponding one of the plurality of control modes, in accordance with the presence of each of flows of a given gas and a given fluid, which are mixed as a mixed fluid contained in the gas system; previously storing a control parameter to be adopted, in a data table every control mode of the plurality of control modes; detecting a flow load of the given gas; selecting a corresponding control mode from the plurality of control modes on the basis of the detected result of the flow load of the given gas, and selecting the control parameter in the selected control mode from the data table; controlling gas heating means for heating the given gas, on the basis of the selected control parameter; detecting a flow load of the given fluid; selecting a corresponding control mode from the plurality of control modes on the basis of the detected result of the flow load of the given gas and the detected result of the flow load of the mixed fluid, and selecting the control parameter in the selected control mode from the data table; and controlling mixed fluid heating means for heating the mixed fluid, on the basis of the selected control parameter.

According to this control method, since a corresponding one of a plurality of control modes is defined in accordance with the presence of a flow of each of a given gas and a given fluid, it is possible to simply classify the plurality of control modes, so that it is possible to easily select a desired control mode. A control parameter to be adopted is previously stored in a data table every control mode so as to control the temperature of a gas system in the optimum state. Since the control parameter to be adopted is previously stored in the data table every control mode of the plurality of control modes, a corresponding control mode can be selected on the basis of the detected result of the flow load of the given gas, and the control parameter in the selected control mode can be quickly selected from the data table, so that it is possible to control the temperature of the gas system in the optimum state every control mode of the plurality control modes.

In this control method, when it is determined on the basis of the detected result of the flow load of the given gas that the flow of the given gas does not exist, a control mode for preheating and controlling the gas heating means itself may be selected, and the control parameter in the selected control mode may be selected from the data table.

In addition, when it is determined on the basis of the detected result of the flow load of the given gas and the detected result of the flow load of the mixed fluid that the flow of the given gas exists and the flow of the given fluid does not exist, a control mode for controlling the gas heating means so as to control a temperature of the gas to a predetermined temperature may be selected, and the control parameter in the selected control mode may be selected from the data table.

In addition, when it is determined on the basis of the detected result of the flow load of the given gas and the detected result of the flow load of the mixed fluid that the flow of the given gas exists and the flow of the given fluid exists, a control mode for controlling the mixed fluid heating means so as to control a temperature of the mixed fluid to a predetermined temperature may be selected, and the control parameter in the selected control mode may be selected from the data table.

Moreover, the control parameter to be adopted in accordance with the magnitude of the flow load of the given gas may be previously stored in the data table, and when it is determined on the basis of the detected result of the flow load of the given gas that the flow of the given gas exists, the control parameter may be selected in accordance with the detected magnitude of the flow load, to control the gas heating means on the basis of the selected control parameter.

In addition, the control parameter to be adopted in accordance with the magnitude of the flow load of the given gas and the magnitude of the flow load of the given fluid may be previously stored in the data table, and when it is determined on the basis of the detected result of the flow load of the given gas and the detected result of the flow load of the mixed fluid that the flow of the given gas exists and the flow of the given fluid exists, the control parameter may be selected in accordance with the detected magnitude of the flow load of the given gas and the detected magnitude of the flow load of the given fluid, to control the mixed fluid heating means on the basis of the selected control parameter.

Thus, since the control parameter to be adopted is previously stored in the data table in accordance with the magnitude of the flow load of the give gas, it is possible to accurately select a control parameter in multistage in accordance with the magnitude of the flow load, and it is possible to accurately control the gas heating means on the basis of the selected control parameter, so that it is possible to accurately control the temperature of the gas system in the optimum state.

According to a third aspect of the present invention, there is provided a method for controlling a gas system having a plurality of control modes, the method comprising the steps of: defining a corresponding one of the plurality of control modes, in accordance with the presence of a flow of a given gas supplied to a treatment chamber; previously storing a control parameter to be adopted, in a data table every control mode of the plurality of control modes; detecting a flow load of the given gas; selecting a corresponding control mode from the plurality of control modes on the basis of the detected result of the flow load of the given gas, and selecting the control parameter in the selected control mode from the data table; and controlling pressure regulating means for regulating a pressure in the treatment chamber, on the basis of the selected control parameter.

According to this control method, since a corresponding one of a plurality of control modes is defined in accordance with the presence of a flow of a given gas supplied to a treatment chamber, it is possible to simply classify the plurality of control modes, so that it is possible to easily select a desired control mode. A control parameter to be adopted is previously stored in a data table every control mode so as to control the pressure in the treatment chamber in the optimum state. Since the control parameter to be adopted is previously stored in the data table every control mode of the plurality of control modes, a corresponding control mode can be selected on the basis of the detected result of the flow load of the given gas, and the control parameter in the selected control mode can be quickly selected from the data table, so that it is possible to control the pressure in the treatment chamber in the optimum state every control mode of the plurality control modes.

In this control method, the given gas may comprise a plurality of different constitutive gases.

In addition, the control parameter to be adopted in accordance with the magnitude of the flow load of the given gas may be previously stored in the data table, and when it is determined on the basis of the detected result of the flow load of the given gas that the flow of the given gas exists, the control parameter may be selected in accordance with the magnitude of the flow load on the basis of the detected result of the flow load of the given gas, to control the pressure regulating means on the basis of the selected control parameter.

Moreover, when it is determined on the basis of the detected result of the flow load of the given gas that the flow of the given gas does not exist, a control mode for controlling the treatment chamber so as to have a predetermined degree of vacuum, and the control parameter in the selected control mode may be selected from the data table.

According to a fourth aspect of the present invention, there is provided a method for controlling a gas system having a plurality of control modes, the method comprising the steps of: defining a corresponding one of the plurality of control modes, in accordance with the presence of a flow of a given gas supplied to a treatment chamber and the presence of plasma production of plasmas produced in the treatment chamber by plasma producing means; previously storing a control parameter to be adopted, in a data table every control mode of the plurality of control modes; detecting a flow load of the given gas; selecting a corresponding control mode from the plurality of control modes on the basis of the detected result of the flow load of the given gas, and selecting the control parameter in the selected control mode from the data table; controlling pressure regulating means for controlling a pressure in the treatment chamber, on the basis of the selected control parameter; detecting the presence of plasma production of plasmas produced in the treatment chamber; selecting a corresponding control mode from the plurality of control modes on the basis of the detected result of the flow load of the given gas and the detected result of the presence of the plasma production, and selecting the control parameter in the selected control mode from the data table; and controlling the pressure in the treatment chamber on the basis of the selected control parameter.

According to this control method, since a corresponding one of a plurality of control modes is defined in accordance with the presence of a flow of a given gas supplied to a treatment chamber and the presence of plasma production of a plasma produced in the treatment chamber, it is possible to simply classify the plurality of control modes, so that it is possible to easily select a desired control mode. A control parameter to be adopted is previously stored in a data table every control mode so as to control the pressure in the treatment chamber in the optimum state. Since the control parameter to be adopted is previously stored in the data table every control mode of the plurality of control modes, a corresponding control mode can be selected on the basis of the detected result of the flow load of the given gas and the detected result of the plasma production, and the control parameter in the selected control mode can be quickly selected from the data table, so that it is possible to control the pressure in the treatment chamber in the optimum state every control mode of the plurality control modes.

In this control method, the given gas may comprise a plurality of different constitutive gases.

In addition, the control parameter to be adopted in accordance with the magnitude of the flow load of the given gas may be previously stored in the data table, and when it is determined on the basis of the detected result of the flow load of the given gas that the flow of the given gas exists, the control parameter may be selected in accordance with the magnitude of the flow load on the basis of the detected result of the flow load of the given gas, to control the pressure regulating means on the basis of the selected control parameter.

In addition, when it is determined on the basis of the detected result of the flow load of the given gas and the detected result of the presence of the plasma production that the flow of the given gas exists and the plasma production does not exists, a corresponding control mode may be selected from the plurality of control modes, and the control parameter in the selected control mode may be selected from the data table, to regulate the pressure in the treatment chamber on the basis of the selected control parameter.

Moreover, when it is determined on the basis of the detected result of the flow load of the given gas and the detected result of the presence of the plasma production that the flow of the given gas exists and the presence of the plasma production exists, a corresponding control mode may be selected from the plurality of control modes, and the control parameter in the selected control mode may be selected from the data table, to regulate the pressure in the treatment chamber on the basis of the selected control parameter.

According to a fifth aspect of the present invention, there is provided a system for controlling a gas system having a plurality of control modes, which comprises: a gas supply line for supplying a given gas to a treatment chamber; gas heating means, provided in the gas supply line, for heating the given gas; gas load detecting means, provided in the gas supply line, for detecting a flow load of the given gas; a data table for defining a corresponding one of the plurality of control modes, in accordance with the presence of a flow of a given gas, and previously storing a control parameter to be adopted, every control mode of the plurality of control modes; and heating control means for selecting a corresponding control mode from the plurality of control modes on the basis of the detected result of the flow load of the given gas, which has been detected by the gas load detecting means, and for selecting the control parameter in the selected control mode from the data table, for controlling the gas heating means to control a temperature of the given gas to a predetermined temperature, on the basis of the selected control parameter.

According to a sixth aspect of the present invention, there is provided a system for controlling a gas system having a plurality of control modes, which comprises: a gas supply line for supplying a given gas to a treatment chamber; gas heating means, provided in the gas supply line, for heating the given gas; mixed gas producing means, provided in the gas supply line, for mixing the given gas with a given fluid to produce a mixed gas; given fluid supply line for connecting the mixed gas producing means to a supply source for the given fluid; gas load detecting means, provided in the gas supply line, for detecting a flow load of the given gas; given fluid load detecting means, provided in the given fluid supply line, for detecting a flow load of the given fluid; a data table for defining a corresponding one of the plurality of control modes, in accordance with the presence of a flow of a given gas and the presence of a flow of the given fluid, and previously storing a control parameter to be adopted, every control mode of the plurality of control modes; and heating control means for selecting a corresponding control mode from the plurality of control modes on the basis of the detected result of the flow load of the given gas, which has been detected by the gas load detecting means, and the detected result of the flow load of the given fluid, which has been detected by the given fluid load detecting means, and for selecting the control parameter in the selected control mode from the data table, for controlling the gas heating means and the mixed gas heating means to control a temperature of the mixed gas to a predetermined temperature, on the basis of the selected control parameter.

In this system, the given gas may be a carrier gas of an inert gas, and the given fluid may be a volatile organic solvent.

According to a seventh aspect of the present invention, there is provided a system for controlling a gas system having a plurality of control modes, which comprises: a gas supply line for supplying a given gas to a treatment chamber; an exhaust line connected to the treatment chamber; pressure regulating means, provided in the exhaust line, for regulating a pressure in the treatment chamber; gas load detecting means, provided in the gas supply line, for detecting a flow load of the given gas; a data table for defining a corresponding one of the plurality of control modes, in accordance with the presence of a flow of a given gas, and previously storing a control parameter to be adopted, every control mode of the plurality of control modes; and pressure control means for selecting a corresponding control mode from the plurality of control modes on the basis of the detected result of the flow load of the given gas, which has been detected by the gas load detecting means, and for selecting the control parameter in the selected control mode from the data table, for controlling the pressure regulating means on the basis of the selected control parameter so that the pressure in the treatment chamber is a predetermined pressure.

According to a eighth aspect of the present invention, there is provided a system for controlling a gas system having a plurality of control modes, which comprises: a gas supply line for supplying a given gas to a treatment chamber; an exhaust line connected to the treatment chamber; pressure regulating means, provided in the exhaust line, for regulating a pressure in the treatment chamber; gas load detecting means, provided in the gas supply line, for detecting a flow load of the given gas; plasma production detecting means for detecting the presence of plasma production of plasmas produced in the treatment chamber by plasma producing means; a data table for defining a corresponding one of the plurality of control modes, in accordance with the presence of a flow of a given gas and the presence of plasma production of plasmas produced in the treatment chamber, and previously storing a control parameter to be adopted, every control mode of the plurality of control modes; and pressure control means for selecting a corresponding control mode from the plurality of control modes on the basis of the detected result of the flow load of the given gas, which has been detected by the gas load detecting means, and on the basis of the presence of plasma production of plasmas produced in the treatment chamber, which has been detected by the plasma production detecting means, and for selecting the control parameter in the selected control mode from the data table, for controlling the pressure regulating means on the basis of the selected control parameter so that the pressure in the treatment chamber is a predetermined pressure.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIG. 1 is a schematic block diagram of the first preferred embodiment of a system for controlling a gas system according to the present invention;

FIG. 2($a$) is a sectional view of a carrier gas heater in the first preferred embodiment, and FIG. 2($b$) is a partially sectional view of a principal part thereof;

FIG. 11 is a schematic block diagram of another drying system; and

FIG. 12($a$) is a sectional view of other embodiment of a heater for a vapor generator, and FIG. 12($b$) is a partially sectional view of a principal part thereof.

DESCRIPTION OF THE PREFERRED EMBODIMENTS

Figure 3:
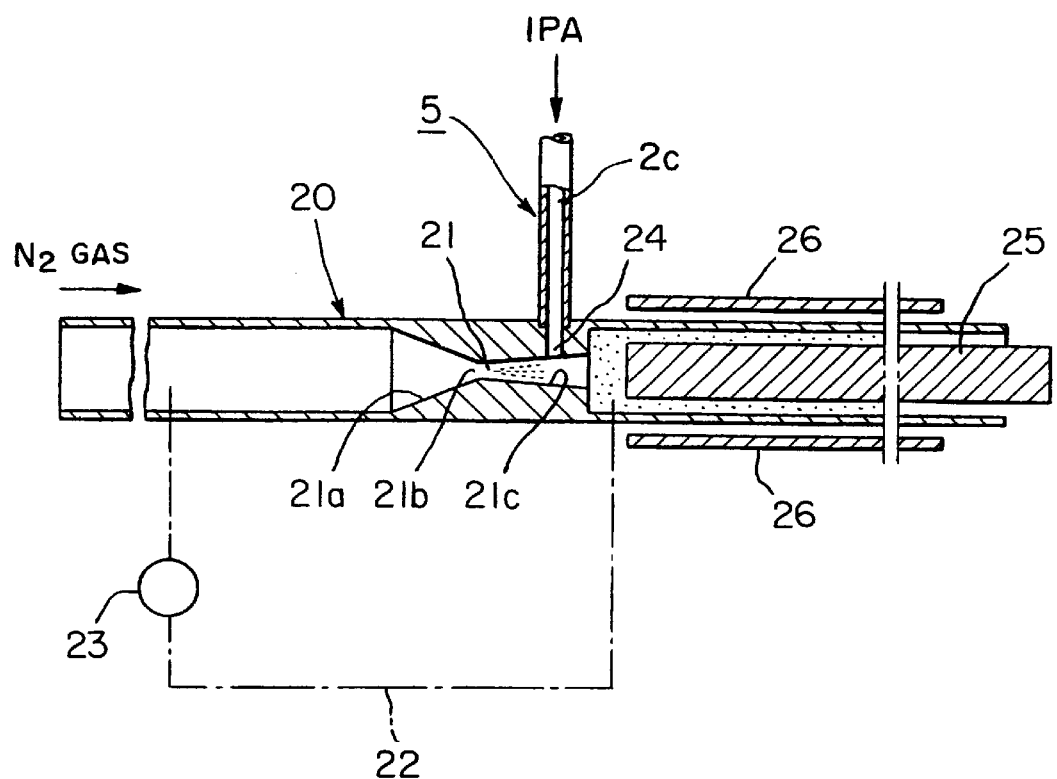
FIG. 3 is a sectional view of an embodiment of a vapor generator in the first preferred embodiment.

Referring now to the accompanying drawings, the preferred embodiments of the present invention will be described in detail below.

[First Preferred Embodiment]

FIG. 1 is a block diagram of the first preferred embodiment of a system for controlling a gas system according to the present invention, which is applied to a cleaning/drying system for semiconductor wafers.

The cleaning/drying system comprises: an $N_2$ gas heater 3 (which will be hereinafter simply referred to as a "heater") serving as an $N_2$ gas heating means connected to a carrier gas source, e.g., a nitrogen ($N_2$) gas source 1, via a supply line 2$a$; a vapor generator 5 serving as a mixed gas (vapor) generating means, which is connected to the heater 3 via a supply line 2$b$ and which is connected to a dry gas providing liquid source, e.g., an IPA source 4, via a supply line 2$c$; and a flow control means 7 provided in a supply line 2$d$ for connecting the vapor generator 5 to a drying treatment chamber 6 (which will be hereinafter simply referred to a "treatment chamber"). In this case, a shut-off valve 8$a$ is provided in the supply line 2$a$, which connects the $N_2$ gas source 1 to the heater 3. In addition, a shut-off valve 8$b$ is provided in the supply line 2$c$, which connects the IPA supply source 4 to the vapor generator 5. The supply source side of the shut-off valve 8b is connected to an IPA recovery section 10 via a branch line 9 and a shut-off valve 8c. As shown by a two-dot chain line in FIG. 1, the vapor generator 5 is connected to an IPA drain pipe 11 if necessary. The drain pipe 111 is provided with a drain valve 112 therein and connected to a branch line 111a, in which a check valve 113 is provided. If the drain pipe 111, the drain valve 112 and so forth are thus connected, a cleaning solution of the like is conveniently drained when cleaning the interior of the vapor generator 5.

As shown in FIG. 2(a), the principal part of the heater 3 comprises: an introducing pipe 11 communicated with the $N_2$ gas supply line 2a; a fluid passage forming pipe 13 inserted into the introducing pipe 11 for forming a spiral fluid passage 12 between the fluid passage forming pipe 13 and the inner wall surface of the introducing pipe 11; and a heating means, e.g., a cartridge heater 14, inserted into the fluid passage forming pipe 13. In this case, one end of the introducing pipe 11 has an inlet 11a connected to the supply line 2a, and the side surface of the other end thereof has an outlet 11b connected to the supply line 2b. As shown in FIG. 2(b), the fluid passage forming pipe 13 is formed with a spiral groove 15, such as a trapezoidal screw thread, in the outer peripheral surface thereof to form the spiral fluid passage 12 between the spiral groove 15 and the inner wall surface 11c of the introducing pipe 11. Furthermore, the spiral fluid passage 12 must not always have such structure. For example, the inner wall surface of the introducing pipe 11 may be formed with a spiral groove, and the outer peripheral surface of the fluid passage forming pipe 13 may be a flat surface. Alternatively, both of the inner wall surface of the introducing pipe 11 and the outer peripheral surface of the fluid passage forming pipe 13 may be formed with spiral grooves to form a spiral fluid passage. Alternatively, the spiral fluid passage 12 may be formed by using a coil spring.

As described above, the spiral fluid passage 12 is formed between the introducing pipe 11, which is connected to the supply line 2a on the side of the $N_2$ gas source 1, and the fluid passage forming pipe 13 or the coil spring, which are inserted into the introducing pipe 11. In addition, the cartridge heater 14 is inserted into the fluid passage forming pipe 13. Thus, it is possible to increase the length of the $N_2$ gas passage contacting the cartridge heater 14, and it is possible to form a spiral flow to increase the velocity of flow in comparison with the case where the spiral fluid passage is not formed. As a result, it is possible to increase the Reynolds number (Re number) and the Nusselt number (Nu number) to put a boundary layer in a turbulent flow region to improve the efficiency of heat transfer of the heater 3. Therefore, it is possible to efficiently heat $N_2$ gas to a predetermined temperature, e.g., 200° C., by a single cartridge heater 14, so that it is possible to reduce the size of the heater 3. Furthermore, if it is required to more increase the heating temperature, an outer tube heater may be provided outside of the introducing pipe 11.

As shown in FIG. 3, the vapor generator 5 comprises a pipe body 20 of, e.g., stainless steel, which is connected to the carrier gas supply line 2b. The inner peripheral surface of the pipe body 20 is formed with a Laval nozzle 21 (a shock wave forming portion), which comprises a convergent nozzle portion 21a gradually narrowing in a flow direction of the carrier gas and a divergent nozzle portion 21c gradually expanding in a flow direction of the carrier gas from a narrow portion 21b of the convergent nozzle portion 21a. The Laval nozzle 21 forms shock waves by a pressure difference between an inlet-side pressure (a primary pressure) and an outlet-side pressure (a secondary pressure) of the Laval nozzle 21. For example, it is possible to form shock waves by suitably selecting the primary pressure ($Kgf/cm^2G$) and the flow rate of passing $N_2$ gas (Nl/min). In this case, a pressure regulating valve 23 is provided in a branch line 22, which connects the primary side of the Laval nozzle 21 to the secondary side thereof, and the production conditions of shock waves are suitably set by adjusting the pressure regulating valve 23. Furthermore, if the primary-side pressure can be increased, it is possible to form shock waves without the need of the pressure regulating valve 23.

Furthermore, if the pressure or flow rate of $N_2$ gas can be regulated in a predetermined high pressure range on the primary side, it is possible to form shock waves without the need of the pressure regulating valve 23. That is, as shown in FIG. 11, an $N_2$ gas pressure regulating means 1a for regulating the pressure or flow rate of $N_2$ gas is connected to an $N_2$ gas source 1, and the branch line 22 and the pressure regulating valve 23 are omitted. In this case, the $N_2$ gas source 1 must be capable of supplying $N_2$ gas of a higher pressure than an ordinary pressure so as to supply $N_2$ gas in a predetermined high pressure range. The degree of the high pressure of $N_2$ gas supplied to the $N_2$ gas source 1 is adjusted by the $N_2$ gas pressure regulating means 1a, so that the pressure difference between the inlet-side pressure (the primary pressure) and outlet-side pressure (the secondary pressure) of the shock wave forming portion 21 can be adjusted to suitably set the production conditions of shock waves.

In the middle of the divergent nozzle portion 21c of the Laval nozzle 21 thus formed, an IPA supply port 24 is provided. The IPA supply port 24 is connected to the IPA source 4 via the IPA supply pipe, i.e., the supply line 2c. In addition, an inner tube heater 25 is inserted into the pipe body 20 on the outlet side of the divergent nozzle portion 21c, and an outer tube heater 26 is provided outside thereof. The inner tube heater 25 and the outer tube heater 26 are associated with each other to form a heating means for the vapor generator 5. In this case, a heater may be provided in the vicinity of the Laval nozzle 21 and the IPA supply port 24.

Furthermore, as shown in FIGS. 12(a) and 12(b), a heater 140 having a similar construction to that of the heater 3 may be used in place of the inner tube heater 25 and the outer tube heater 26.

As shown in FIG. 12(a), the principal part of the heater 140 comprises: an introducing pipe 143 communicated with the shock wave forming portion 21; a fluid passage forming pipe 145 inserted into the introducing pipe 143 for forming a spiral fluid passage 144 between the fluid passage forming pipe 145 and the inner wall surface of the introducing pipe 143; and a heating means, e.g., a cartridge heater 146, which is inserted into the fluid passage forming pipe 145.

In this case, one end of the introducing pipe 143 has an inlet 143a connected to the shock wave forming portion 21, and the side surface of the other end thereof has an outlet 143b connected to the supply line 131b. As shown in FIG. 12(b), the fluid passage forming pipe 145 is formed with a spiral groove 147, such as a trapezoidal screw thread, in the outer peripheral surface thereof to form the spiral fluid passage 144 between the spiral groove 147 and the inner wall surface 143c of the introducing pipe 143. Furthermore, the spiral fluid passage 144 must not always have such structure. For example, the inner wall surface of the introducing pipe 143 may be formed with a spiral groove, and the outer peripheral surface of the fluid passage forming pipe 145 may be a flat surface. Alternatively, both of the inner wall surface of the introducing pipe 143 and the outer peripheral surface of the fluid passage forming pipe 145 may be formed with spiral grooves to form a spiral fluid passage. Furthermore, a heater for heating the outside of the introducing pipe 143 may be provided as a heating means in place of the cartridge heater 146.

As described above, the spiral fluid passage 144 is formed between the introducing pipe 143, which is connected to the shock wave forming portion 21, and the fluid passage forming pipe 145, which are inserted into the introducing pipe 143, and the cartridge heater 146 is inserted into the fluid passage forming pipe 145. Thus, it is possible to increase the length of the IPA gas passage contacting the cartridge heater 146, and it is possible to form a spiral flow to increase the velocity of flow in comparison with the case where the spiral fluid passage is not formed. As a result, it is possible to increase the Reynolds number (Re number) and the Nusselt number (Nu number) to put a boundary layer in a turbulent flow region to improve the efficiency of heat transfer of the heater 140. Therefore, it is possible to efficiently heat $N_2$ gas to a predetermined temperature, e.g., 200° C., by a single cartridge heater 146, so that it is possible to reduce the size of the heater 140. Furthermore, if it is required to more increase the heating temperature, an outer tube heater may be provided outside of the introducing pipe 143.

With this construction, if IPA is supplied from the IPA source 4 via the IPA supply port 24 of the Laval nozzle 21, the IPA is atomized by the shock waves formed by the Laval nozzle 21, and then, the atomized IPA is heated by the heaters 25 and 26 to generate IPA vapor.

Furthermore, while the IPA supply port 24 has been provided on the secondary side of the Laval nozzle 21, i.e., downstream of the shock wave producing position, the IPA supply port 24 must not always have such a construction. For example, the IPA supply port 24 may be provided on the primary side of the Laval nozzle 21, i.e., upstream of the shock wave producing position, so as to atomize IPA by the shock waves after mixing the IPA with $N_2$ gas.

As shown in FIGS. 1 through 4, the flow control means 7 comprises: an opening-angle regulating valve, e.g., a diaphragm valve 30, which is provided in the supply line 2d; and a control valve, e.g., a micro valve 32, for controlling a working pressure of the diaphragm valve 30 on the basis of a signal outputted from a control means, e.g., a central processing unit (CPU) 40, which compares a signal outputted from a pressure sensor 31 serving as a detecting means for detecting the pressure in the treatment chamber 6, with a previously stored information.

Figure 4:
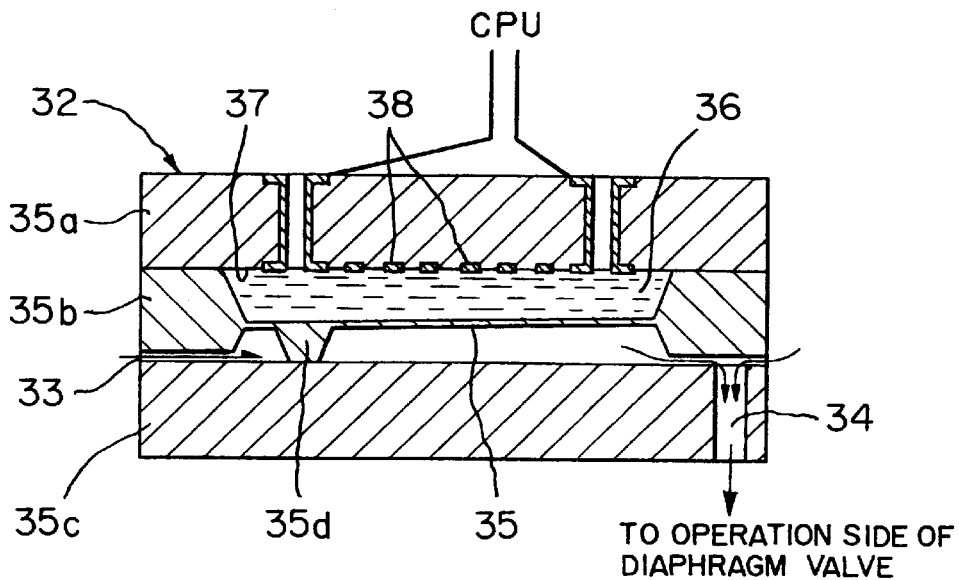
FIG. 4 is a sectional view of an embodiment of a flow control means and a control valve thereof in the first preferred embodiment.

In this case, for example as shown in FIG. 4, the micro valve 32 has an inlet fluid passage 33 for a working fluid, e.g., air, for the diaphragm valve 30, and a discharge fluid passage 34 communicated with the inlet fluid passage 33. A chamber 37 for containing therein a control liquid, e.g., a thermal expansible oil 36, is formed on a surface facing the discharge fluid passage 34 via a flexible member 35. A plurality of resistance heaters 38 are provided on a surface facing the flexible member 35 in the chamber 37. The flexible member 35 has an intermediate member 35b provided between an upper member 35a and a lower member 35c, and a seat 35d connected to the lower member 35c. The intermediate member 35b opens and closes the discharge fluid passage 34 by the distortion of the flexible member 35. The micro valve 32 is made of silicon.

With this construction, when a signal outputted from the CPU 40 is digital-to-analog converted to be transmitted to the resistance heater 38, the resistance heater 38 is heated, and the control liquid, i.e., the oil 36, is expanded and contracted. Thus, the flexible member 35 moves toward the inlet to open the upper portion of the discharge fluid passage 34, so that the control fluid pressure, i.e., the gas pressure, can be adjusted. Therefore, the diaphragm valve 30 is operated by the fluid, i.e., air, which is delayed and controlled by the micro valve 32, and the previously stored information is compared with the pressure in the treatment chamber 6. Thus, the operation of the diaphragm 30 can be controlled to supply $N_2$ gas to the treatment chamber 6, and the time required to restore the pressure in the treatment chamber 6 can be controlled.

Figure 5:
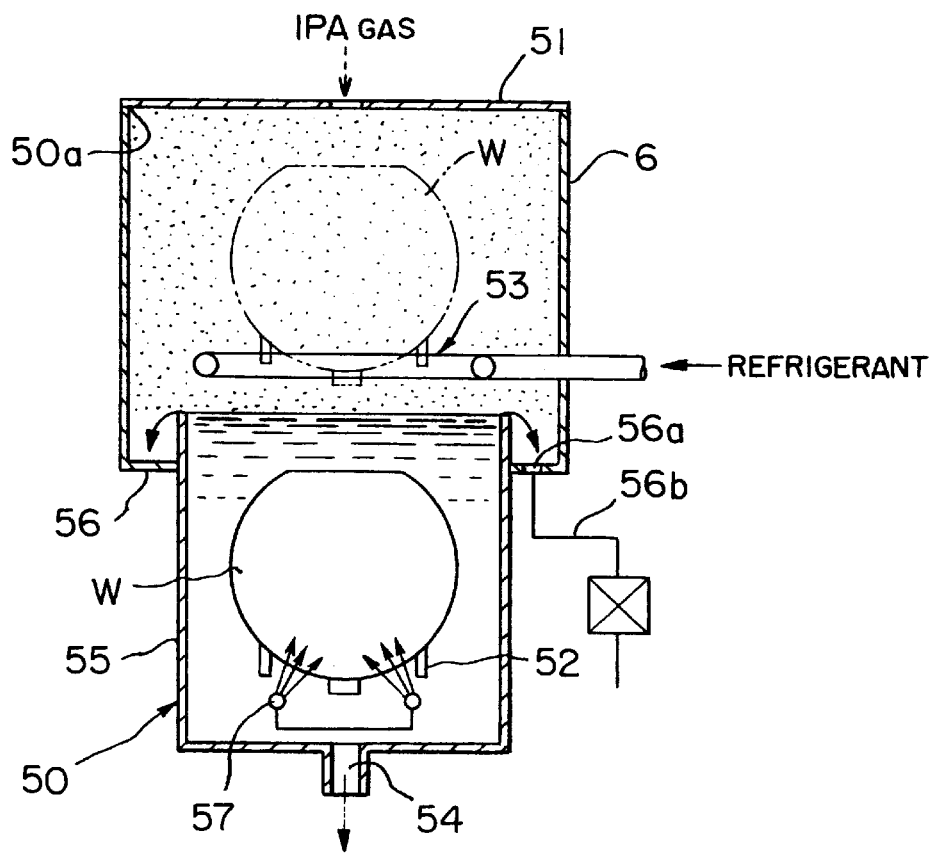
FIG. 5 is a schematic sectional view of a treatment chamber in the first preferred embodiment.

As shown in FIG. 5, the treatment chamber 6 stores or contains therein a cleaning solution, such as a chemical of, e.g., hydroacid fluoride, and pure water. The treatment chamber 6 is arranged above a cleaning bath 5 for dipping wafers W in the stored cleaning solution. A lid 51 is provided so as to open and close an opening 50a, which is formed above the treatment chamber 6 for carrying the wafers W in and out of the treatment chamber 6. Between the treatment chamber 6 and the cleaning bath 50, there is provided a holding means, e.g., a wafer boat 52, for holding a plurality of wafers W, e.g., 50 wafers W, to move the wafers W into the cleaning bath 50 and the treatment chamber 6. In the treatment chamber 6, a cooling pipe 53 for cooling IPA gas supplied to the treatment chamber 6 may be provided. The cleaning bath 50 comprises an inner bath 55 having a discharge port 54 at the bottom thereof, and an outer bath 56 for receiving the cleaning solution overflowing the inner bath 55. A chemical or pure water is supplied from a chemical or pure water supply nozzle 57, which is provided on the lower portion of the inner bath 55, into the inner bath 55 to be stored therein. The wafers W are immersed in the chemical or pure water, which is stored in the inner bath 55, to be cleaned. A discharge pipe 56b is connected to a discharge port 56a provided at the bottom of the outer bath 56. With this construction, the cleaned wafers W are moved into the treatment chamber 6 by means of the wafer boat 52 to contact IPS gas supplied to the treatment chamber 6, so that vapor of IPA gas is condensed or absorbed to remove the moisture content of the wafers W to dry the wafers W.

A filter 60 is provided in the supply line 2d downstream (secondary side) of the diaphragm valve 30 so as to be capable of supplying a dry gas having a small amount of particles. In addition, an insulation heater 62 is provided outside the supply line 2d so as to be capable of maintaining the temperature of IPA gas to be constant. Moreover, an IPA gas temperature sensor 61 (a temperature detecting means) is provided in the supply line 2d on the side of the treatment chamber 6 to measure the temperature of IPA gas flowing through the supply line 2d.

As shown in FIG. 1, a gas load detecting means, e.g., a flow sensor 41, for detecting a load based on the presence of a flow of $N_2$ gas flowing through the supply line 2a is provided in the supply line 2a. In addition, a gas load detecting means, e.g., a flow sensor 42, for detecting a flow load based on the presence of a flow of IPA gas flowing through the supply line 2d is provided in the supply line 2d. Moreover, an IPA supply pump 43 (a fluid flow detecting means) capable of detecting the presence of a flow of IPA is provided in the IPA supply line 2c.

Load detection signals outputted from the flow sensors 41 and 42 and the IPA supply pump 43 are transmitted to the CPU 40. In the CPU 40, operation is carried out on the basis of previously stored information corresponding to the flow load, such as the presence of flows of $N_2$ gas, IPA gas and IPA, i.e., on the basis of previously stored PID control parameters (control parameters) including three actions of proportional, integral and derivative actions, to output a control signal for controlling the $N_2$ gas heater 3, the heaters 25 and 26 of the vapor generator 5 and the insulation heater 62. The PID control parameters (control parameters) are stored in a data table 100.

Referring to the flowcharts of FIGS. 6 through 8, the temperature control of $N_2$ gas, IPA and IPA gas (a dry gas; a mixed gas) in the cleaning/drying system will be described below.

Temperature Control of $N_2$ Gas Heater

Figure 6:
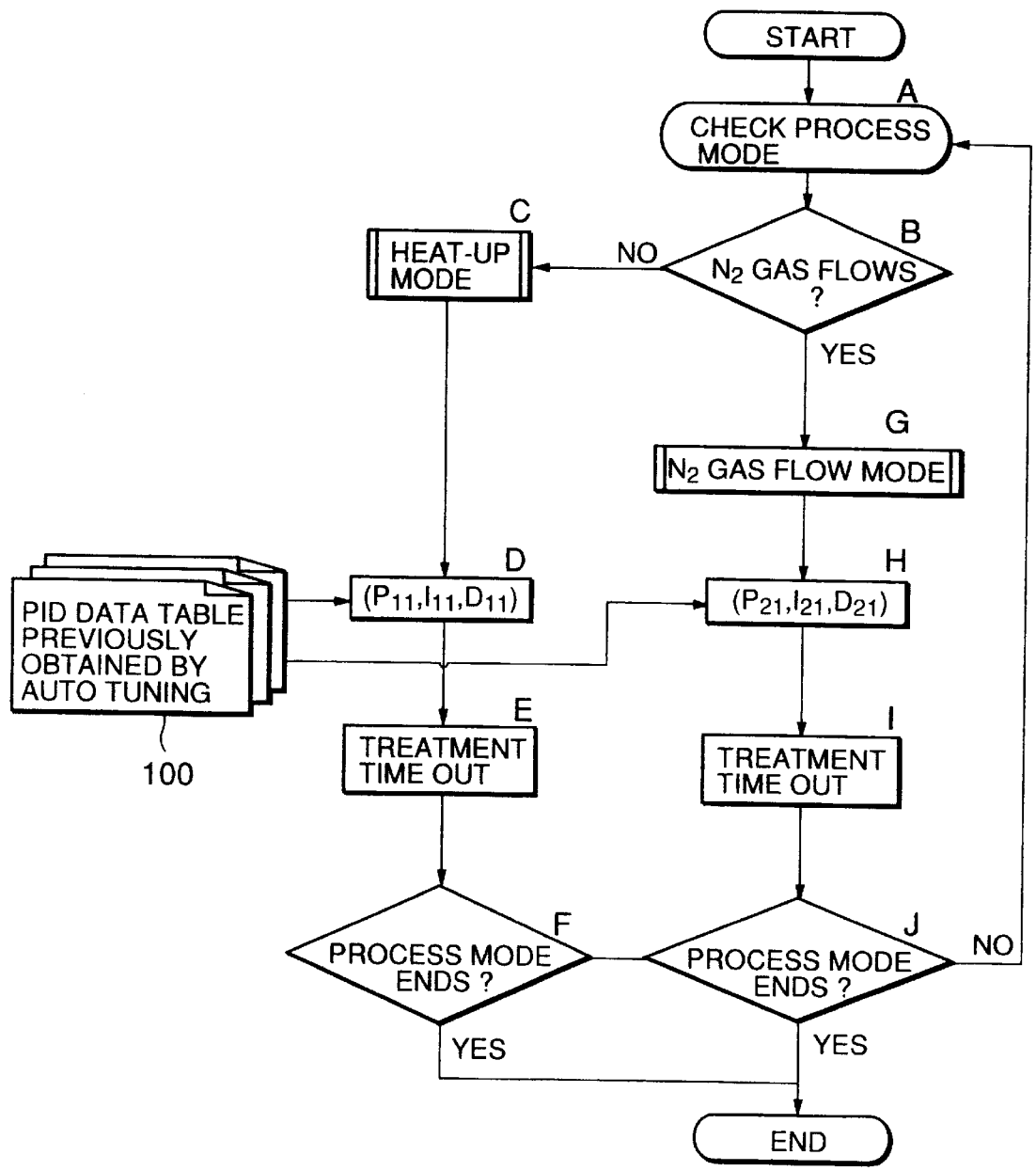
FIG. 6 is a flowchart of a temperature control method for a carrier gas heater in the first preferred embodiment.

As shown in FIG. 6, after checking a process mode wherein the flow rate and supply timing of $N_2$ gas in the $N_2$ gas heater 3 have been set (step A), it is checked by the flow sensor 41 whether $N_2$ gas is flowing (step B). When $N_2$ gas is not flowing, a heat-up mode is set in response to a control signal outputted from the CPU 40 (step C), and a temperature control corresponding to the heat-up mode of the $N_2$ gas heater 3 is carried out on the basis of PID parameters (P11, I11, D11), which have been previously obtained by the auto tuning (steps D, E). The PID parameters (P11, I11, D11) are stored in the data table 100. Thus, it is determined whether the process mode has ended (step F). When the process mode ends, the temperature control corresponding to the heat-up mode is completed. When the process mode has not ended, the process mode is checked again (step A).

On the other hand, when $N_2$ gas is flowing through the supply line 2a, an $N_2$ gas flow mode is set (step G), and a temperature control corresponding to the $N_2$ gas flow mode of the $N_2$ gas heater 3 is carried out on the basis of PID parameters (P21, I21, D21), which have been previously obtained by the auto tuning (steps H, I). The PID parameters (P21, I21, D21) are stored in the data table 100. Thus, it is determined whether the process mode has ended (step J). When the process mode has ended, the temperature control corresponding to the $N_2$ gas flow mode is completed. When the process mode has not ended, the process mode is checked again (step A), and then, the above steps are repeated to carry out the temperature control of the $N_2$ gas heater 3.

Therefore, in accordance with the condition whether $N_2$ gas has been supplied from the $N_2$ gas source 1 to the supply line 2a, the previously stored PID parameters (control parameters) are selected to preheat or heat the $N_2$ gas heater 3, so that the temperature of $N_2$ gas can be in the optimum state.

While only the PID parameters (P21, I21, D21) based on the presence of a flow of $N_2$ gas detected by the flow sensor 41 have been previously stored in the data table 100 in the $N_2$ gas flow mode (steps H, I), the PID parameters may be previously stored in multistage in accordance with the magnitude of the flow load detected by the flow sensor 41, i.e., the magnitude of the flow rate of $N_2$ gas. Thus, since the PID parameters adopted in accordance with the magnitude of the flow load of $N_2$ gas are previously stored in the data table 100, the PID parameters can be accurately set and selected in multistage in accordance with the magnitude of the flow load, and the $N_2$ gas heater 3 can be accurately controlled on the basis of the selected PID parameters, so that the temperature of $N_2$ gas can be accurately controlled in the optimum state.

Temperature Control of Vapor Generator

Figure 7:
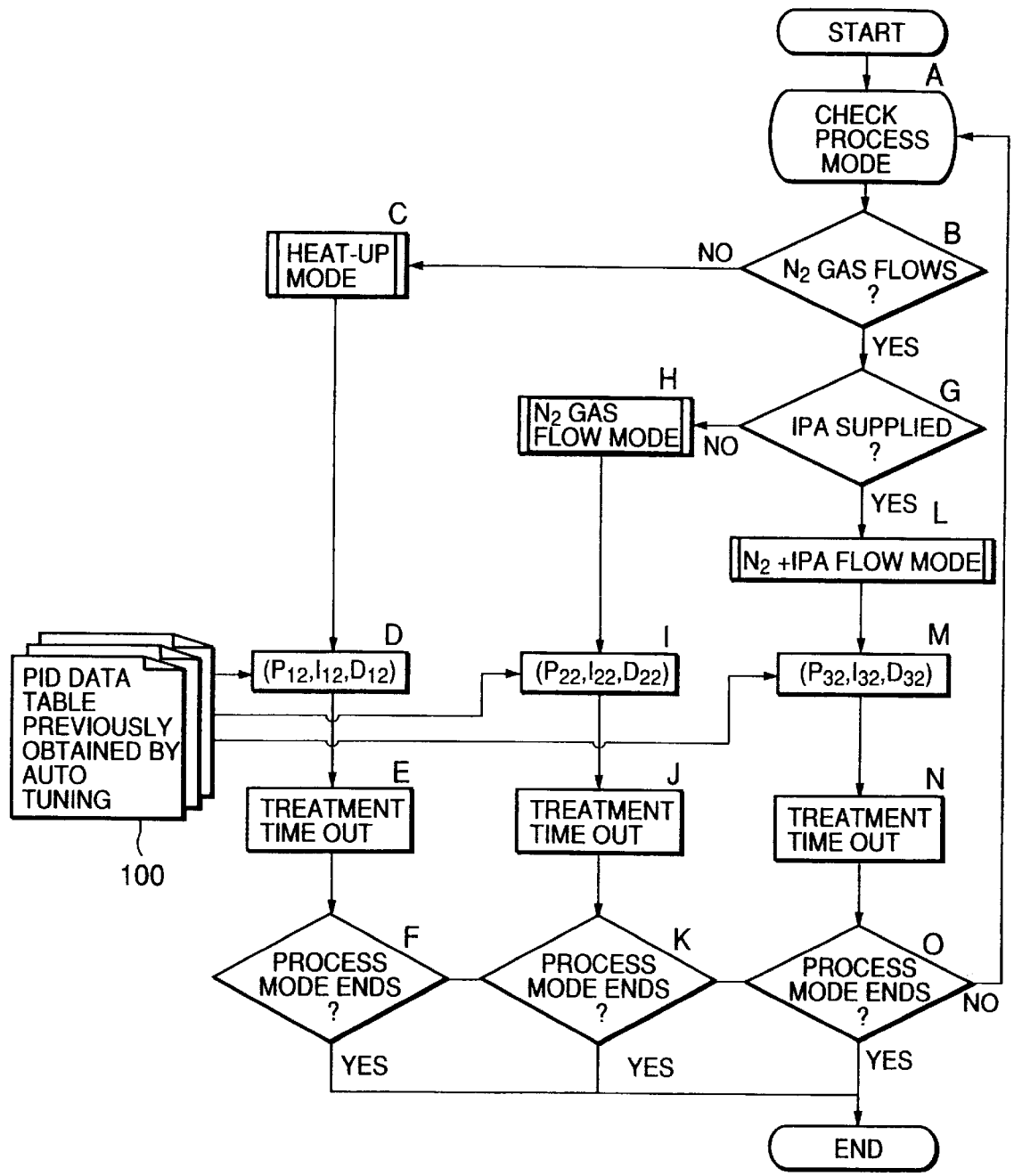
FIG. 7 is a flowchart of a temperature control method for a vapor generator in the first preferred embodiment.

As shown in FIG. 7, after checking a process mode wherein the flow rates and supply timings of $N_2$ gas and IPA in the vapor generator 5 have been set (step A), it is checked by the flow sensor 41 whether $N_2$ gas is flowing (step B). When $N_2$ gas is not flowing, a heat-up mode is set in response to a control signal outputted from the CPU 40 (step C), and a temperature control corresponding to the heat-up mode of the heaters 25 and 26 of the vapor generator 5 is carried out on the basis of PID parameters (P12, I12, D12), which have been previously obtained by the auto tuning (steps D, E). Thus, it is determined whether the process mode has ended (step F). When the process mode has ended, the temperature control corresponding to the heat-up mode is completed. When the process mode has not ended, the process mode is checked again (step A).

On the other hand, when $N_2$ gas is flowing through the supply line 2a, it is determined on the basis of the presence of drive of the IPA supply pump 43 whether IPA has been supplied (step G). When IPA has not been supplied, an $N_2$ gas flow mode is set (step H), and a temperature control corresponding to the $N_2$ gas flow mode of the heaters 25 and 26 of the vapor generator 5, through which $N_2$ gas passes, is carried out on the basis of PID parameters (P22, I22, D22), which have been previously obtained by the auto tuning (steps I, J). Thus, it is determined whether the process mode has ended (step K). When the process mode has ended, the heating is completed. When the process mode has not ended, the process mode is checked again (step A).

Moreover, when IPA is flowing through the supply line 2c, an $N_2$+IPA mode is set in response to a control signal outputted from the CPU 40 (step L), the heaters 25 and 26 of the vapor generator 5 are heated on the basis of PID parameters (P32, I32, D32), which have been previously obtained by the auto tuning (steps M, N). Thus, it is determined whether the process mode has ended (step O). When the process mode has ended, the heating is completed. When the process mode has not ended, the process mode is checked again (step A), and then, the above steps are repeated to carry out the temperature control corresponding to the $N_2$+IPA flow mode of the heaters 25 and 26 of the vapor generator 5.

Therefore, in accordance with the condition whether $N_2$ gas has been supplied from the $N_2$ gas source 1 to the supply line 2a, or in accordance with the condition whether IPA has been supplied from the IPA source 4 to the vapor generator 5 via the supply line 2c, the previously stored PID parameters (control parameters) are selected to control the temperatures of the $N_2$ gas heater 3 or the heaters 25 and 26 of the vapor generator 5, so that the temperatures of $N_2$ and dry gases can be in the optimum state.

While only the PID parameters (P32, I32, D32) based on the presence of a flow of $N_2$ gas detected by the flow sensor 41 and on the presence of drive of the IPA supply pump 43 have been previously stored in the data table 100 in the $N_2$+IPA mode (step L), the PID parameters may be previously stored in multistage in accordance with the magnitude of the flow rate of $N_2$ gas and the magnitude of the amount of the supplied IPA. Thus, since the PID parameters adopted in accordance with the magnitude of the flow load of $N_2$ gas and the magnitude of the amount of the supplied IPA are previously stored in the data table 100, the PID parameters can be accurately set and selected in multistage in accordance with the magnitude of the flow loads of $N_2$ gas and IPA, and the heaters 25 and 26 of the vapor generator 5 can be accurately controlled on the basis of the selected PID parameters, so that the temperatures of $N_2$ and dry gases can be accurately controlled in the optimum state.

Temperature Control of Dry Gas

Figure 8:
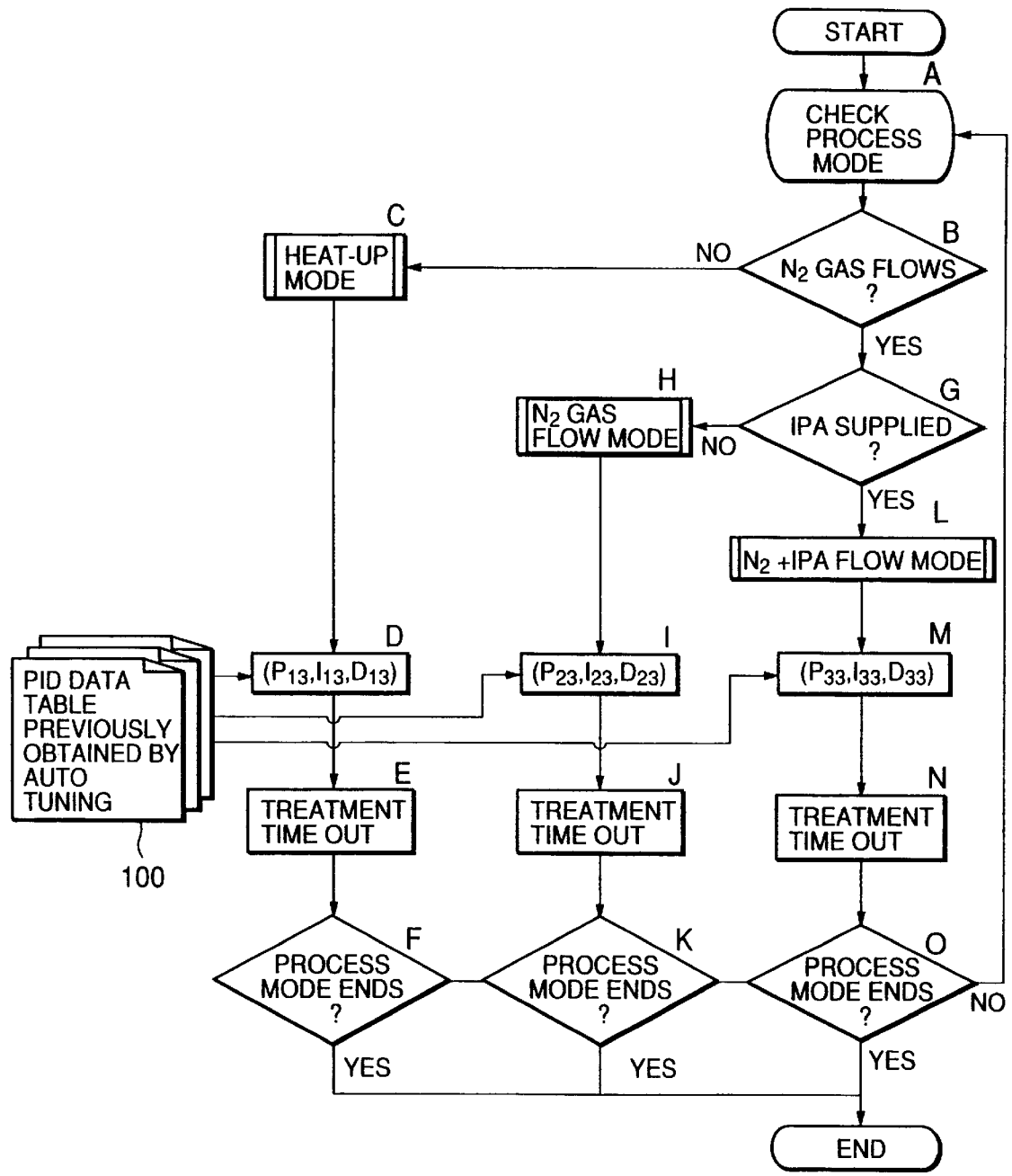
FIG. 8 is a flowchart of a temperature control for a dry gas supply section in the first preferred embodiment.

As shown in FIG. 8, after checking a process mode wherein the flow rates and supply timings of $N_2$ gas and IPA in the vapor generator 5 have been set (step A), it is checked by the flow sensor 41 whether $N_2$ gas is flowing (step B). When $N_2$ gas is not flowing, a heat-up mode is set in response to a control signal outputted from the CPU 40 (step C), and a temperature control corresponding to the heat-up mode of the insulation heater 62 is carried out on the basis of PID parameters (P13, I13, D13), which have been previously obtained by the auto tuning (steps D, E). Thus, it is determined whether the process mode has ended (step F). When the process mode has ended, the temperature control corresponding to the heat-up mode is completed. When the process mode has not ended, the process mode is checked again (step A).

On the other hand, when $N_2$ gas is flowing through the supply line 2a, it is determined on the basis of the presence of drive of the IPA supply pump 43 whether IPA has been supplied (step G). When IPA has not been supplied, an $N_2$ gas flow mode is set (step H), and a temperature control corresponding to the $N_2$ gas flow mode of the insulation heater 62, through which $N_2$ gas passes, is carried out on the basis of PID parameters (P23, I23, D23), which have been previously obtained by the auto tuning (steps I, J). Thus, it is determined whether the process mode has ended (step K). When the process mode has ended, the temperature control corresponding to the $N_2$ gas flow mode is completed. When the process mode has not ended, the process mode is checked again (step A).

Moreover, when IPA is flowing through the supply line 2c, the passing of the dry gas ($N_2$+IPA) is detected by the flow sensor 42 to set an $N_2$+IPA mode in response to a control signal outputted from the CPU 40 (step L), and a temperature control corresponding to the $N_2$+IPA mode of the insulation heater 62 is carried out on the basis of PID parameters (P33, I33, D33), which have been previously obtained by the auto tuning (steps M, N). Thus, it is determined whether the process mode has ended (step O). When the process mode has ended, the temperature control corresponding to the $N_2$+IPA flow mode is completed. When the process mode has not ended, the process mode is checked again (step A), and then, the above steps are repeated to carry out the temperature control of the insulation heater 62.

Therefore, in accordance with the condition whether $N_2$ gas has been supplied from the $N_2$ gas source 1 to the supply line 2a, or in accordance with the condition whether IPA has been supplied from the IPA source 4 to the vapor generator 5 via the supply line 2c, or in accordance with the condition whether the dry gas is flowing through the supply line 2d, the previously stored PID parameters (control parameters) are selected to control the temperature of the $N_2$ gas heater 3, the heaters 25 and 26 of the vapor generator 5 or the insulation heater 62, so that the temperatures of $N_2$ and dry gases can be in the optimum state.

While only the PID parameters (P33, I33, D33) based on the presence of the passing of the dry gas ($N_2$+IPA) detected by the flow sensor 42 have been previously stored in the data table 100 in the $N_2$+IPA mode (step L), the PID parameters may be previously stored in multistage in accordance with the magnitude of the flow rate of the passing dry gas ($N_2$+IPA) detected by the flow sensor 42. Thus, since the PID parameters adopted in accordance with the magnitude of the flow rate of the passing dry gas ($N_2$+IPA) are previously stored in the data table 100, the PID parameters can be accurately set and selected in multistage in accordance with the magnitude of the flow rate of the passing dry gas ($N_2$+IPA), and the insulation heater 62 can be accurately controlled on the basis of the selected PID parameters, so that the temperatures of $N_2$ and dry gases can be accurately controlled in the optimum state.

[Second Preferred Embodiment]

Figure 9:
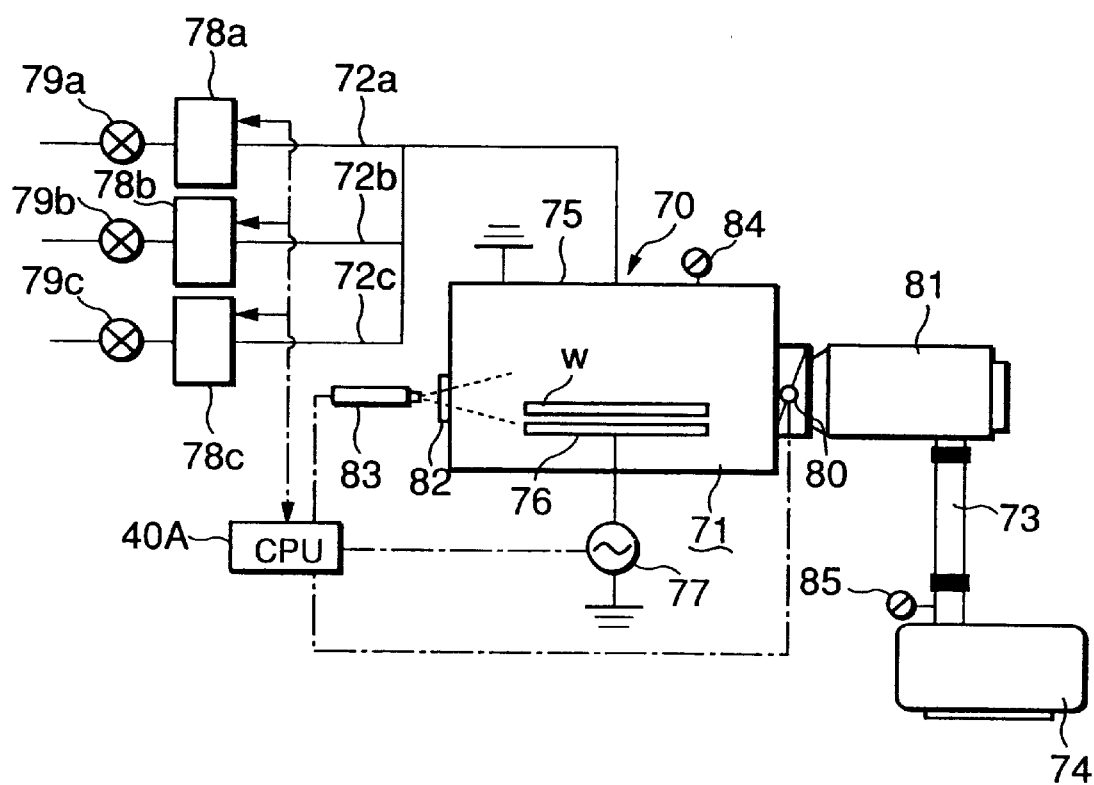
FIG. 9 is a schematic block diagram of the second preferred embodiment of a system for controlling a gas system according to the present invention.

FIG. 9 is a schematic block diagram of the second preferred embodiment of a system for controlling a gas system according to the present invention. In the second preferred embodiment, a system for controlling a gas system according to the present invention is applied to a pressure control for an etching system.

The etching system comprises: a container 70 having a closed treatment chamber 71; gas supply lines 72a through 72c for connecting a gas introducing portion provided in the container 70 to different kinds of gas sources (not shown); an exhaust line 73 connected to an evacuation port provided in the treatment chamber; and an evacuation derive, e.g., a vacuum pump 74, connected to the exhaust line 73.

In this case, an upper flat plate electrode 75, which also serves to supply gases to the treatment chamber 71, and a lower flat plate electrode 76, which faces the upper flat plate electrode 75 and which also serves as a susceptor, are located in the container 70. The lower flat plate electrode 76 for transferring a wafer W thereon is connected to a high-frequency power supply 77, and the upper flat plate electrode 75 is grounded via the container 70.

Mass flow controllers 78a through 78c for detecting and controlling the flow rates of various gasses and pneumatic shut-off valves 79a through 79c are provided in the gas supply lines 72a through 72c, respectively. Detection signals outputted from the mass flow controllers 78a through 78c are transmitted to a control means, e.g., a CPU 40A.

On the other hand, a control valve 80 serving as a pressure regulating means for regulating the pressure in the treatment chamber 71 is provided in the exhaust line 73 on the evacuation port side thereof, and a turbo-molecular pump 81 is provided downstream thereof In this case, the opening angle of the control valve 80 is adjusted on the basis of a control signal outputted from the CPU 40A.

A window 82 for monitoring the interior of the treatment chamber 71 is provided in the side wall of the container 70. Outside of the window 82, there is provided a monochromator 83 for detecting the presence of plasma emission produced by the impression of a high-frequency power from the high-frequency power supply 77. Detection signals outputted from the monochromator 83 are transmitted to the CPU 40A. In addition, between the container 70 and the turbo-molecular pump 81 in the exhaust line 73 and between the turbo-molecular pump 81 and the vacuum pump 74, pressure gages 84 and 85 for measuring the pressures in the respective portions are provided.

In the etching system with the above construction, after a wafer W is transferred onto the lower flat plate electrode 76 by a transport means (not shown), the control valve 80 is adjusted on the basis of a control signal outputted from the CPU 40A, and the vacuum pump is driven to evacuate the interior of the treatment chamber 71 to a predetermined pressure-reduced atmosphere. Then, gases are supplied from predetermined gas sources to the treatment chamber 71, and a high-frequency power is applied from the high-frequency power supply 77 to produce a plasma discharge between the electrodes 75 and 76 to etch the wafer W with ions, electrons and neutral active species in the produced plasmas.

At this time, the pressure in the treatment chamber 71 changes in accordance with the flow rates of various gasses and the ignition of plasma. Therefore, according to the present invention, the PID parameters (control parameters) corresponding to the load based on the presence of the flow rates of various gases, which have been previously stored in the CPU 40A, are selected to control the control valve 80, so that the treatment pressure is controlled to the optimum pressure.

Figure 10:
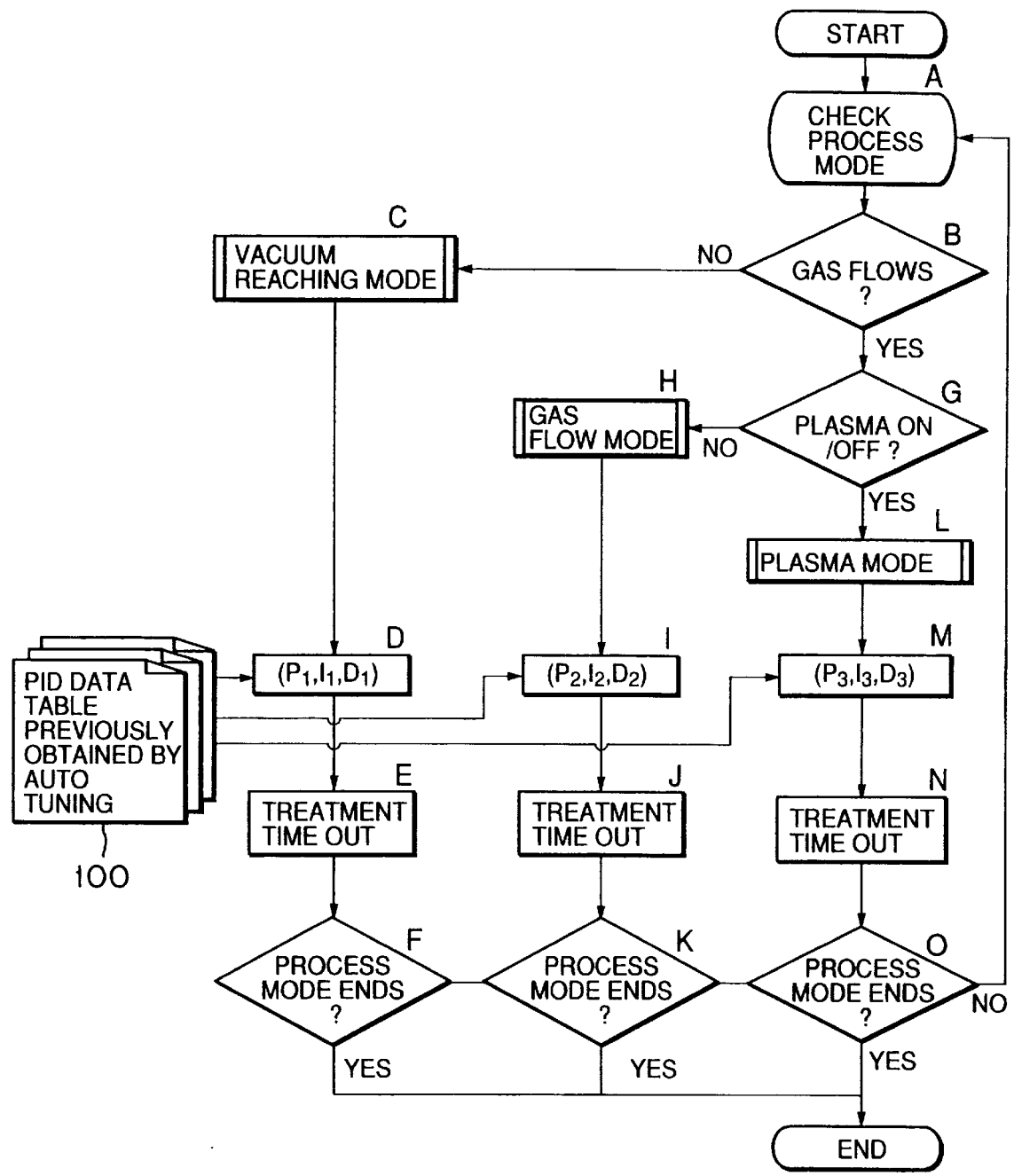
FIG. 10 is a flowchart of a pressure control method in the second preferred embodiment.

Referring to the flowchart of FIG. 10, a pressure control in the second preferred embodiment will be described below.

First, after checking a process mode wherein the flow rates and supply timings of gases to be used have been set (step A), it is checked by the mass flow meters 78a through 78c whether the gasses are flowing (step B). When the gases are not flowing, a vacuum reaching mode (a mode wherein it is checked whether leak in the treatment chamber 71 is normal) is set in response to a control signal outputted from the CPU 40A (step C), and the opening angle of the control valve 80 is adjusted on the basis of PID parameters (P1, I1, D1), which have been previously obtained by the auto tuning (steps D, E). Thus, it is determined whether the process mode has ended (step F). When the process mode has ended, the adjustment of the opening angle of the control valve 80 is completed. When the process mode has not ended, the process mode is checked again (step A).

On the other hand, when gases are flowing through the gas supply lines 72a through 72c, it is determined by the monochromator 83 whether plasmas have been produced by the impression of a high-frequency power by means of the high-frequency power supply 77 (step G). When no plasma has been produced, a gas flow mode is set by a control signal outputted from the CPU 40 (step H), and the opening angle of the control valve 80 is adjusted on the basis of PID parameters (P2, I2, D2), which have been previously obtained by the auto tuning (steps I, J). Thus, it is determined whether the process mode has ended (step K). When the process mode has ended, the adjustment of the opening angle of the control valve 80 is completed. When the process mode has not ended, the process mode is checked again (step A).

Moreover, when plasma emission has been detected by the monochromator 83 and plasmas have been produced, a plasma mode is set (step L), and the opening angle of the control valve 80 is adjusted on the basis of PID parameters (P3, I3, D3), which have been previously obtained by the auto tuning (steps M, N). Thus, it is determined whether the process mode has ended (step O). When the process mode has ended, the adjustment of the opening angle of the control valve 80 is completed. When the process mode has not ended, the process mode is checked again (step A), and then, the above steps are repeated to adjust the opening angle of the control valve 80.

Therefore, in accordance with the condition whether gases have been supplied from the gas sources to the treatment chamber 71 via the supply lines 72a through 72c or in accordance with the condition whether plasmas have been produced, the previously stored PID parameters (control parameters) are selected to adjust the opening angle of the control valve 80, so that the treatment pressure in the treatment chamber 71 can be in the optimum state.

[Other Preferred Embodiments]

While the first preferred embodiment of a system for controlling a gas system according to the present invention has been applied to a system for cleaning semiconductor wafers, the system of the present invention may be applied to treatment systems other than a cleaning system and/or to glass substrates for LCDs other than semiconductor wafers.

While the second preferred embodiment of a system for controlling a gas system according to the present invention has been applied to a plasma etching system, the system of the present invention may be applied to etching systems other than the plasma etching system or to a system for controlling the pressure in a treatment chamber to be a predetermined pressure to supply various gases to the treatment chamber, e.g., a CVD system or a sputtering system.

As described above, the present invention has the following excellent advantages.

(1) According to the present invention, control parameters corresponding to a flow load, such as the presence of a flow of a given gas, are previously stored in a data table. The flow load, such as the presence of the flow of the given gas, is detected by a gas load detecting means, and detection signals thereof are transmitted to a control means. Then, control parameters are selected on the basis of the detection signals outputted from the control means to control a heating means. Thus, the temperatures of gases in various states can be controlled in the optimum state.

(2) According to the present invention, control parameters corresponding to a flow load, such as the presence of flows of a given gas and a given fluid, which are mixed as a mixed fluid, are previously stored in a data table, and control parameters are selected on the basis of detection signals of a flow load, such as the presence of flows of the given gas and fluid, to control the temperatures of the given gas and fluid. Thus, the temperatures of the individual given gas and the mixed fluid in various states can be controlled in the optimum state.

(3) According to the present invention, while a given gas is not flowing, previously stored control parameters are selected to preheat a gas heating means for heating the given gas. Thus, it is possible to immediately control the given gas flowing thereafter so as to have the optimum temperature, so that it is possible to improve the efficiency of a treatment. In addition, while a given gas is not flowing, previously stored control parameters are selected to control the temperature of a passing given gas. Thus, it is possible to achieve temperature controls corresponding to various states.

(4) According to the present invention, control parameters corresponding to a flow load, such as the presence of a flow of a given gas, are previously stored in a data table. The flow load, such as the presence of the flow of the given gas, is detected by a gas load detecting means, and detection signals thereof are transmitted to a control means. Then, control parameters are selected on the basis of the detection signals outputted from the data table to control a pressure regulating means. Thus, the pressures of gasses in various states can be controlled in the optimum state.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A method for controlling a gas system having a plurality of control modes, said method comprising the steps of:

defining a corresponding one of said plurality of control modes, in accordance with the presence of a flow of a given gas contained in said gas system;

previously storing a control parameter to be adopted, in a data table every control mode of said plurality of control modes;

detecting a flow load of said given gas;

selecting a corresponding control mode from said plurality of control modes on the basis of a detected result of the flow load of said given gas, and selecting said control parameter in the selected control mode from said data table; and controlling gas heating means for heating said given gas, on the basis of the selected control parameter.

2. A method for controlling a gas system, as set forth in claim 1, wherein when it is determined on the basis of the detected result of said flow load of said given gas that the flow of said given gas does not exist, a control mode for preheating and controlling said gas heating means itself is selected, and said control parameter in the selected control mode is selected from said data table.

3. A method for controlling a gas system, as set forth in claim 1, wherein said control parameter to be adopted in accordance with the magnitude of said flow load of said given gas is previously stored in said data table, and wherein when it is determined on the basis of the detected result of said flow load of said given gas that the flow of said given gas exists, said control parameter is selected in accordance with the magnitude of said flow load on the basis of the detected result of said flow load of said given gas, to control said gas heating means on the basis of the selected control parameter.

4. A method for controlling a gas system having a plurality of control modes, said method comprising the steps of:

defining a corresponding one of said plurality of control modes, in accordance with the presence of each of flows of a given gas and a given fluid, which are mixed as a mixed fluid contained in said gas system;

previously storing a control parameter to be adopted, in a data table every control mode of said plurality of control modes;

detecting a flow load of said given gas;

selecting a corresponding control mode from said plurality of control modes on the basis of a detected result of the flow load of said given gas, and selecting said control parameter in the selected control mode from said data table;

controlling gas heating means for heating said given gas, on the basis of the selected control parameter;

detecting a flow load of said given fluid;

selecting a corresponding control mode from said plurality of control modes on the basis of a detected result of the flow load of said given gas and a detected result of the flow load of said mixed fluid, and selecting said control parameter in the selected control mode from said data table; and controlling mixed fluid heating means for heating said mixed fluid, on the basis of the selected control parameter.

5. A method for controlling a gas system, as set forth in claim 4, wherein when it is determined on the basis of the detected result of said flow load of said given gas that the flow of said given gas does not exist, a control mode for preheating and controlling said gas heating means itself is selected, and said control parameter in the selected control mode is selected from said data table.

6. A method for controlling a gas system, as set forth in claim 4, wherein when it is determined on the basis of the detected result of the flow load of said given gas and the detected result of the flow load of said mixed fluid that the flow of said given gas exists and the flow of said given fluid does not exist, a control mode for controlling said gas heating means so as to control a temperature of said gas to a predetermined temperature is selected, and said control parameter in the selected control mode is selected from said data table.

7. A method for controlling a gas system, as set forth in claim 4, wherein when it is determined on the basis of the detected result of the flow load of said given gas and the detected result of the flow load of said mixed fluid that the flow of said given gas exists and the flow of said given fluid exists, a control mode for controlling said mixed fluid heating means so as to control a temperature of said mixed fluid to a predetermined temperature is selected, and said control parameter in the selected control mode is selected from said data table.

8. A method for controlling a gas system, as set forth in claim 4, wherein said control parameter to be adopted in accordance with the magnitude of said flow load of said given gas is previously stored in said data table, and wherein when it is determined on the basis of the detected result of said flow load of said given gas that the flow of said given gas exists, said control parameter is selected in accordance with the detected magnitude of said flow load, to control said gas heating means on the basis of the selected control parameter.

9. A method for controlling a gas system, as set forth in claim 4, wherein said control parameter to be adopted in accordance with the magnitude of said flow load of said given gas and the magnitude of said flow load of said given fluid is previously stored in said data table, and wherein when it is determined on the basis of the detected result of the flow load of said given gas and the detected result of the flow load of said mixed fluid that the flow of said given gas exists and the flow of said given fluid exists, said control parameter is selected in accordance with the detected magnitude of said flow load of said given gas and the detected magnitude of said flow load of said given fluid, to control said mixed fluid heating means on the basis of the selected control parameter.

10. A method for controlling a gas system having a plurality of control modes, said method comprising the steps of:

defining a corresponding one of said plurality of control modes, in accordance with the presence of a flow of a given gas supplied to a treatment chamber;

previously storing a control parameter to be adopted, in a data table every control mode of said plurality of control modes;

detecting a flow load of said given gas;

selecting a corresponding control mode from said plurality of control modes on the basis of a detected result of the flow load of said given gas, and selecting said control parameter in the selected control mode from said data table; and controlling pressure regulating means for regulating a pressure in said treatment chamber, on the basis of the selected control parameter.

11. A method for controlling a gas system, as set forth in claim 10, wherein said given gas comprises a plurality of different constitutive gases.

12. A method for controlling a gas system, as set forth in claim 10, wherein said control parameter to be adopted in accordance with the magnitude of said flow load of said given gas is previously stored in said data table, and wherein when it is determined on the basis of the detected result of said flow load of said given gas that the flow of said given gas exists, said control parameter is selected in accordance with the magnitude of said flow load on the basis of the detected result of said flow load of said given gas, to control said pressure regulating means on the basis of the selected control parameter.

13. A method for controlling a gas system, as set forth in claim 10, wherein when it is determined on the basis of the detected result of said flow load of said given gas that the flow of said given gas does not exist, a control mode for controlling said treatment chamber so as to have a predetermined degree of vacuum, and said control parameter in the selected control mode is selected from said data table.

14. A method for controlling a gas system having a plurality of control modes, said method comprising the steps of:

defining a corresponding one of said plurality of control modes, in accordance with the presence of a flow of a given gas supplied to a treatment chamber and the presence of plasma production of plasmas produced in said treatment chamber by plasma producing means;

previously storing a control parameter to be adopted, in a data table every control mode of said plurality of control modes;

detecting a flow load of said given gas;

selecting a corresponding control mode from said plurality of control modes on the basis of a detected result of the flow load of said given gas, and selecting said control parameter in the selected control mode from said data table;

controlling pressure regulating means for controlling a pressure in said treatment chamber, on the basis of the selected control parameter;

detecting the presence of plasma production of plasmas produced in said treatment chamber;

selecting a corresponding control mode from said plurality of control modes on the basis of a detected result of the flow load of said given gas and a detected result of the presence of said plasma production, and selecting said control parameter in the selected control mode from said data table; and controlling said pressure in said treatment chamber on the basis of the selected control parameter.

15. A method for controlling a gas system, as set forth in claim 14, wherein said given gas comprises a plurality of different constitutive gases.

16. A method for controlling a gas system, as set forth in claim 14, wherein said control parameter to be adopted in accordance with the magnitude of said flow load of said given gas is previously stored in said data table, and wherein when it is determined on the basis of the detected result of said flow load of said given gas that the flow of said given gas exists, said control parameter is selected in accordance with the magnitude of said flow load on the basis of the detected result of said flow load of said given gas, to control said pressure regulating means on the basis of the selected control parameter.

17. A method for controlling a gas system, as set forth in claim 14, wherein when it is determined on the basis of the detected result of the flow load of said given gas and the detected result of the presence of said plasma production that the flow of said given gas exists and said plasma production does not exists, a corresponding control mode is selected from said plurality of control modes, and said control parameter in the selected control mode is selected from said data table, to regulate said pressure in said treatment chamber on the basis of the selected control parameter.

18. A method for controlling a gas system, as set forth in claim 14, wherein when it is determined on the basis of the detected result of the flow load of said given gas and the detected result of the presence of said plasma production that the flow of said given gas exists and the presence of said plasma production exists, a corresponding control mode is selected from said plurality of control modes, and said control parameter in the selected control mode is selected from said data table, to regulate said pressure in said treatment chamber on the basis of the selected control parameter.

19. A system for controlling a gas system having a plurality of control modes, which comprises:

a gas supply line for supplying a given gas to a treatment chamber;

gas heating means, provided in said gas supply line, for heating said given gas;

gas load detecting means, provided in said gas supply line, for detecting a flow load of said given gas;

a data table for defining a corresponding one of said plurality of control modes, in accordance with the presence of a flow of a given gas, and previously storing a control parameter to be adopted, every control mode of said plurality of control modes; and heating control means for selecting a corresponding control mode from said plurality of control modes on the basis of a detected result of the flow load of said given gas, which has been detected by said gas load detecting means, and for selecting said control parameter in the selected control mode from said data table, for controlling said gas heating means to control a temperature of said given gas to a predetermined temperature, on the basis of the selected control parameter.

20. A system for controlling a gas system having a plurality of control modes, which comprises:

a gas supply line for supplying a given gas to a treatment chamber;

gas heating means, provided in said gas supply line, for heating said given gas;

mixed gas producing means, provided in said gas supply line, for mixing said given gas with a given fluid to produce a mixed gas;

given fluid supply line for connecting said mixed gas producing means to a supply source for said given fluid;

gas load detecting means, provided in said gas supply line, for detecting a flow load of said given gas;

given fluid load detecting means, provided in said given fluid supply line, for detecting a flow load of said given fluid;

a data table for defining a corresponding one of said plurality of control modes, in accordance with the presence of a flow of a given gas and the presence of a flow of said given fluid, and previously storing a control parameter to be adopted, every control mode of said plurality of control modes; and heating control means for selecting a corresponding control mode from said plurality of control modes on the basis of a detected result of the flow load of said given gas, which has been detected by said gas load detecting means, and a detected result of the flow load of said given fluid, which has been detected by said given fluid load detecting means, and for selecting said control parameter in the selected control mode from said data table, for controlling said gas heating means and said mixed gas heating means to control a temperature of said mixed gas to a predetermined temperature, on the basis of the selected control parameter.

21. A system for controlling a gas system, as set forth in claim 20, wherein said given gas is a carrier gas of an inert gas, and said given fluid is a volatile organic solvent.

22. A system for controlling a gas system having a plurality of control modes, which comprises:

a gas supply line for supplying a given gas to a treatment chamber;

an exhaust line connected to said treatment chamber;

pressure regulating means, provided in said exhaust line, for regulating a pressure in said treatment chamber;

gas load detecting means, provided in said gas supply line, for detecting a flow load of said given gas;

a data table for defining a corresponding one of said plurality of control modes, in accordance with the presence of a flow of a given gas, and previously storing a control parameter to be adopted, every control mode of said plurality of control modes; and pressure control means for selecting a corresponding control mode from said plurality of control modes on the basis of a detected result of the flow load of said given gas, which has been detected by said gas load detecting means, and for selecting said control parameter in the selected control mode from said data table, for controlling said pressure regulating means on the basis of the selected control parameter so that said pressure in said treatment chamber is a predetermined pressure.

23. A system for controlling a gas system having a plurality of control modes, which comprises:

a gas supply line for supplying a given gas to a treatment chamber;

an exhaust line connected to said treatment chamber;

pressure regulating means, provided in said exhaust line, for regulating a pressure in said treatment chamber;

gas load detecting means, provided in said gas supply line, for detecting a flow load of said given gas;

plasma production detecting means for detecting the presence of plasma production of plasmas produced in said treatment chamber by plasma producing means;

a data table for defining a corresponding one of said plurality of control modes, in accordance with the presence of a flow of a given gas and the presence of plasma production of plasmas produced in said treatment chamber, and previously storing a control parameter to be adopted, every control mode of said plurality of control modes; and pressure control means for selecting a corresponding control mode from said plurality of control modes on the basis of a detected result of the flow load of said given gas, which has been detected by said gas load detecting means, and on the basis of the presence of plasma production of plasmas produced in said treatment chamber, which has been detected by said plasma production detecting means, and for selecting said control parameter in the selected control mode from said data table, for controlling said pressure regulating means on the basis of the selected control parameter so that said pressure in said treatment chamber is a predetermined pressure.

* * * * *